(12) United States Patent
Chen

(10) Patent No.: US 11,873,954 B2
(45) Date of Patent: Jan. 16, 2024

(54) LIGHTING BOARD AND LUMINAIRE USING THE LIGHTING BOARD

(71) Applicant: SIGNIFY HOLDING B.V., Eindhoven (NL)

(72) Inventor: Li Xiong Chen, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/022,639

(22) PCT Filed: Sep. 2, 2021

(86) PCT No.: PCT/EP2021/074234
§ 371 (c)(1),
(2) Date: Feb. 22, 2023

(87) PCT Pub. No.: WO2022/049181
PCT Pub. Date: Mar. 10, 2022

(65) Prior Publication Data
US 2023/0313955 A1    Oct. 5, 2023

(30) Foreign Application Priority Data
Sep. 3, 2020  (WO) ................ PCT/CN2020/113331

(51) Int. Cl.
*F21K 9/90*      (2016.01)
*F21Y 115/10*    (2016.01)
*F21V 19/00*     (2006.01)
*F21V 7/28*      (2018.01)

(52) U.S. Cl.
CPC .................. *F21K 9/90* (2013.01); *F21V 7/28* (2018.02); *F21V 19/005* (2013.01); *F21V 19/0025* (2013.01); *F21Y 2115/10* (2016.08)

(58) Field of Classification Search
CPC .......... F21K 9/90; F21V 7/28; F21V 19/0025; F21V 19/005; F21V 23/005; F21Y 2115/10; H05K 1/0274
See application file for complete search history.

(56) References Cited

U.S. PATENT DOCUMENTS

| | | | | |
|---|---|---|---|---|
| 2010/0117103 A1* | 5/2010 | Marfeld | .................. | H01L 24/24 |
| | | | | 257/91 |
| 2013/0099276 A1* | 4/2013 | Fukushima | ............. | H01L 33/46 |
| | | | | 257/99 |
| 2013/0328070 A1* | 12/2013 | Hussell | .................. | H05K 3/244 |
| | | | | 438/27 |

(Continued)

FOREIGN PATENT DOCUMENTS

| | | |
|---|---|---|
| CN | 108679583 A | 10/2018 |
| DE | 102010032836 A1 | 2/2012 |
| JP | 2006196684 A | 7/2006 |

*Primary Examiner* — Thomas M Sember

(57) ABSTRACT

A lighting board (10), comprising: a printed circuit board (12); a set of solid state lighting elements mounted on the printed circuit board, each having a light emitting surface; a set of electrical components (16) mounted on the printed circuit board; and a reflective covering over the printed circuit board, wherein the reflective covering is provided over the set of electrical components and over the set of lighting elements, and comprises openings at least for the light emitting surfaces of the lighting elements.

5 Claims, 5 Drawing Sheets

(56) References Cited

U.S. PATENT DOCUMENTS

2014/0001497 A1* 1/2014 Jagt ................... H01L 33/647
  29/829
2016/0315069 A1 10/2016 Rong et al.
2017/0236987 A1* 8/2017 Jagt ..................... H01L 33/62
  257/98

* cited by examiner

LIGHTING BOARD AND LUMINAIRE USING THE LIGHTING BOARD

CROSS-REFERENCE TO PRIOR APPLICATIONS

This application is the U.S. National Phase application under 35 U.S.C. § 371 of International Application No. PCT/EP2021/074234, filed on Sep. 2, 2021, which claims the benefit of Chinese Patent Application No. PCT/EN2020/113331, filed on Sep. 3, 2020. These applications are hereby incorporated by reference herein.

FIELD OF THE INVENTION

This invention relates to lighting boards, namely printed circuit board on which solid state light emitting elements are mounted, and to luminaires using the lighting board, such as downlights.

BACKGROUND OF THE INVENTION

A lighting board carries lighting elements such as LEDs and circuitry such as drive circuitry. It is desirable to mount the driver circuitry on a lighting board in order to reduce the number of separate components, and thereby reduce costs. The drive circuitry for example comprises integrated circuit chips as well as passive components such as capacitors and inductors. However, any desired electrical components may be mounted on the lighting board.

It is known to coat an LED board with white paint (such as an oil-based white paint) to increase reflectivity. The white paint is typically provided over the printed circuit board before the components are applied, and those components are for example fixed by reflow soldering, as part of a surface mount process.

One issue is that the white paint may discolor and become yellow after reflow soldering, due to the heat applied. Furthermore, the electrical and electronic components are typically not white in appearance so that they reduce the lighting efficiency, and they may also create non-uniformity in the light output.

It has been proposed to address this issue by providing a reflective covering frame over the non-lighting components or to provide an annular conical barrier over the components (e.g. if they are mounted around the periphery). However, these approaches add components and complexity to the manufacturing and assembly processes.

There is a need for a low cost and simple way to improve the reflectivity of the lighting board.

SUMMARY OF THE INVENTION

The invention is defined by the claims.

According to examples in accordance with an aspect of the invention, there is provided a lighting board, comprising:
a printed circuit board;
a set of solid state lighting elements mounted on the printed circuit board, each having a light emitting surface;
a set of electrical components mounted on the printed circuit board; and
a reflective covering over the printed circuit board, wherein the reflective covering is provided over the set of electrical components and over the set of lighting elements, and comprises openings at least for the light emitting surfaces of the lighting elements.

This lighting board has electrical components, other than the lighting elements, covered by a reflective covering. It is noted that "electrical components" is intended to cover both passive and active (i.e. electronic) components. The reflective covering (i.e. coating, or film, or layer) is applied after the electrical components and the lighting elements have been mounted. This is what is meant by provided "over" the set of lighting elements, i.e. later in the manufacturing process. In practice, the openings may in fact mean that the reflective covering is not on top of the lighting elements at all, but the reflective covering is nevertheless higher in terms of the order of the layered build-up of the lighting board. In this way, the mounting of the components and lighting elements using heat, such as reflow soldering, will not discolor or otherwise damage the reflective covering. The openings prevent light being blocked from the lighting elements.

The solid state lighting elements are preferably LEDs.

The reflective covering may overlap non-light emitting regions of the set of lighting elements. The reflective covering is thus at a physically higher level within the structure than the lighting elements, as well as being provided after the lighting elements are mounted. Alternatively, the openings may fully surround the lighting elements.

The reflective covering for example comprise a white paint, for example a white spray paint.

The set of electrical components comprise components of driver circuitry for the set of lighting elements. These components are typically black, and therefore will absorb light so reducing the light efficiency, and/or create shadow areas in the light output.

The invention also provides a luminaire comprising:
a housing having an open end;
the lighting board as defined above within the housing, with the light emitting surfaces of the set of lighting elements facing the open end of the housing.

The luminaire is for example a downlight. The housing provides reflection of light towards the output, to improve the light output efficiency.

A diffuser is for example provided at the open end of the housing. However, other optical parts may be provided at the light exit window.

The reflective covering of the printed circuit board may also extend over an inner surface of the housing. Thus, the reflective covering may be uniform over the lighting board and the inner surface of the housing, so that there is minimum impact on the eventual light output.

The invention also provides a method of manufacturing a lighting board, comprising:
mounting a set of solid state lighting elements on a printed circuit board;
mounting a set of electrical components on the printed circuit board;
providing a shielding layer over at least light emitting surfaces of the set of lighting elements;
providing a reflective covering over the shielding layer, wherein the reflective covering covers the set of electrical components but is shielded from the light emitting surfaces of the set of lighting elements by the shielding layer; and
removing the shielding layer.

The mounting of the set of lighting elements and the electrical components may be in either order or at the same time. However, this precedes the provision of the shielding layer. Thus, the reflective covering is not damaged by the mounting operation.

The reflective covering for example comprises a white paint such as a white spray paint so that providing the covering comprises spraying the reflective covering. The set of electrical components for example comprise components of driver circuitry for the set of lighting elements.

The mounting of the lighting elements and the mounting of the set of electrical components may comprise reflow soldering. As this is carried out before the reflective covering is provided, the heat of the reflow soldering does not cause damage to the reflective covering.

The shielding layer may comprise a paper mask with an adhesive layer, and removing the shielding layer is by peeling the layer off the lighting elements. This is one example of a suitable shielding layer for providing a barrier to a sprayed reflective layer.

The method may comprise:
- after mounting the set of lighting elements and the set of electrical components on the printed circuit board, mounting the printed circuit board within a housing of a luminaire;
- providing the shielding layer before or after mounting the printed circuit board within the housing of a luminaire; and
- providing the reflective covering over the shielding layer and removing the shielding layer after mounting the printed circuit board to the housing of the luminaire.

The reflective covering is thus provided after the initial stages of luminaire assembly, but before fitting a diffuser or other exit window over the housing.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
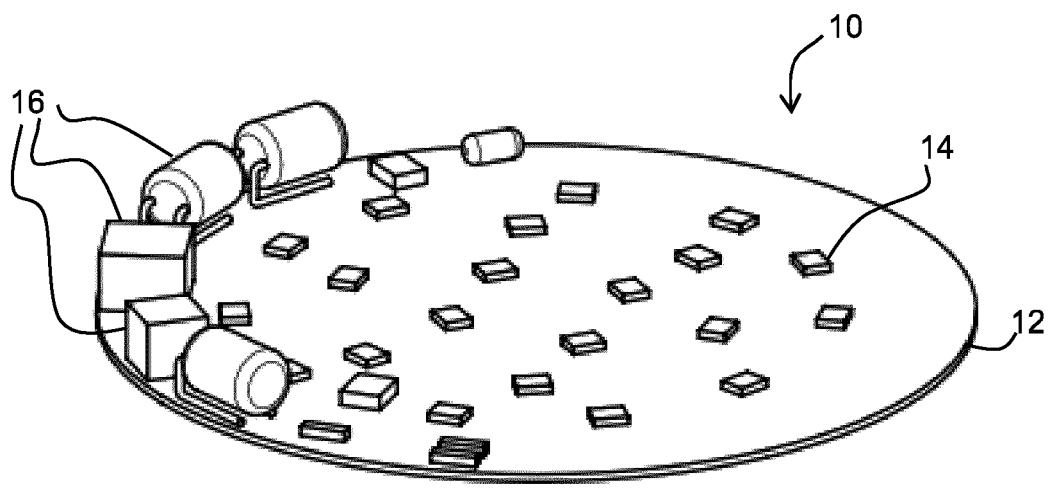
FIG. 1 shows a first example of a lighting board.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

FIG. 1 shows a lighting board 10 comprising a printed circuit board 12 which carries a set of LEDs 14 and other electrical components 16 such as driver integrated circuits and passive components such as inductors, transformers and capacitors. The LEDs have a light emitting surface facing normally away from the underlying printed circuit board 12.

In this example, the printed circuit board is generally circular, and the electrical components 16 are around the periphery, whereas the LEDs 14 are distributed across a central area of the printed circuit board.

Figure 2:
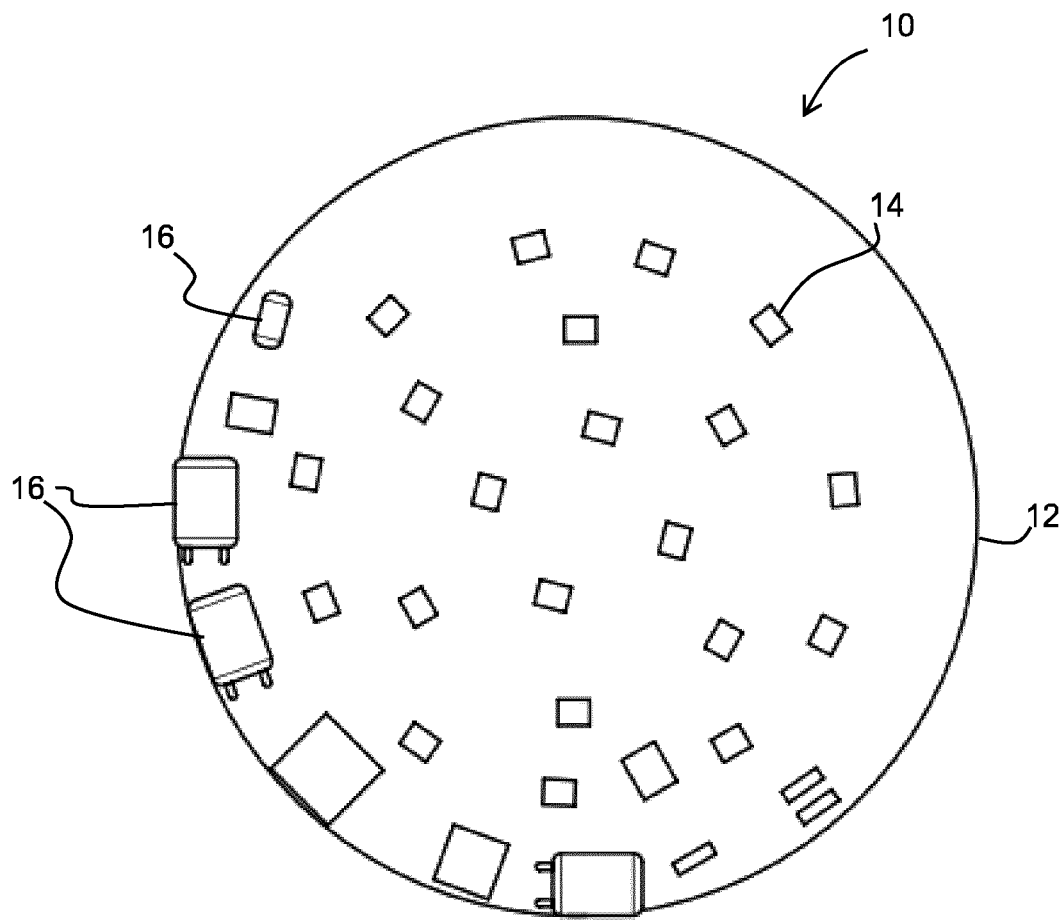
FIG. 2 shows a plan view of the lighting board of FIG. 1.

FIG. 2 shows a plan view of the lighting board of FIG. 1.

Figure 3:
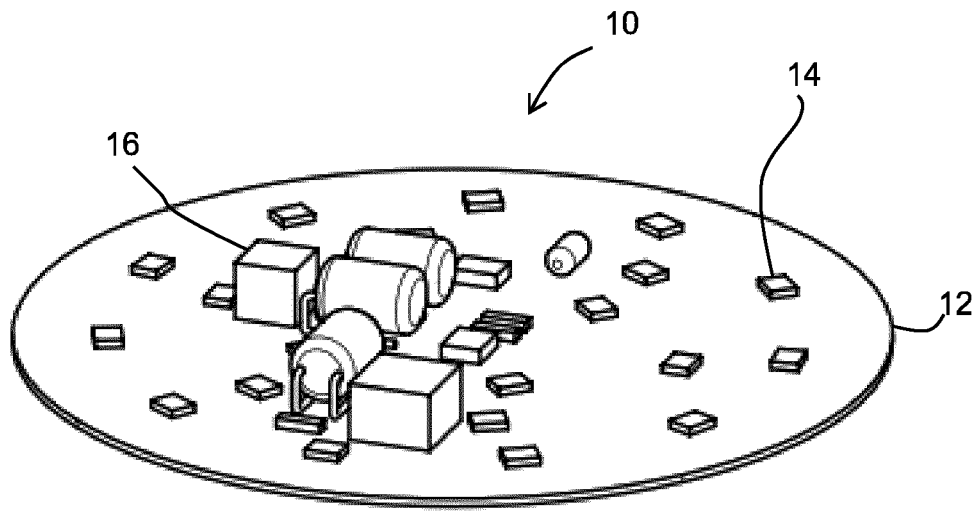
FIG. 3 shows a second example of a lighting board.

FIG. 3 shows a second example of a lighting board 10 again comprising a printed circuit board 12 which carries a set of LEDs 14 and other electrical components 16. In this example, the electrical components 16 are distributed within the central area of the printed circuit board among the LEDs 14.

Figure 4:
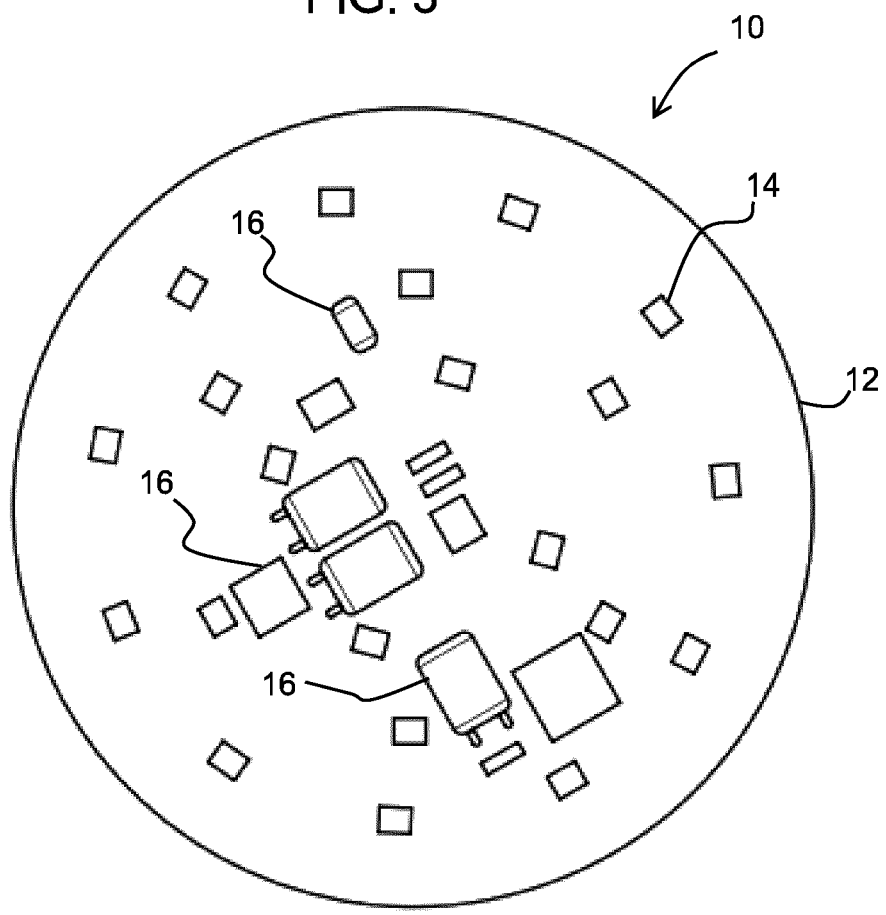
FIG. 4 shows a plan view of the lighting board of FIG. 3.

FIG. 4 shows a plan view of the lighting board of FIG. 3.

In conventional designs of the lighting board, the printed circuit board is coated with white paint before the components are attached, and this attachment is for example by reflow soldering. The white paint can turn yellow after reflow soldering, and the non-white surfaces of the electrical components are light-absorbing. These two issues reduce the lighting efficiency, and the non-white surfaces of the electrical components can produce a dark shadow on a diffuser at the light exit window of the luminaire.

The invention provides a lighting board in which a reflective covering is provided over a set of electrical components with openings at least for the light emitting surfaces of the lighting elements, such as LEDs. The covering is applied after the electrical components and the lighting elements have been mounted. In this way, the mounting of the components and lighting elements using heat, such as reflow soldering, will not discolor or otherwise damage the reflective covering.

The openings are provided by applying a shielding layer to protect the light emitting surfaces of the lighting elements during application of the reflective covering.

Figure 5:
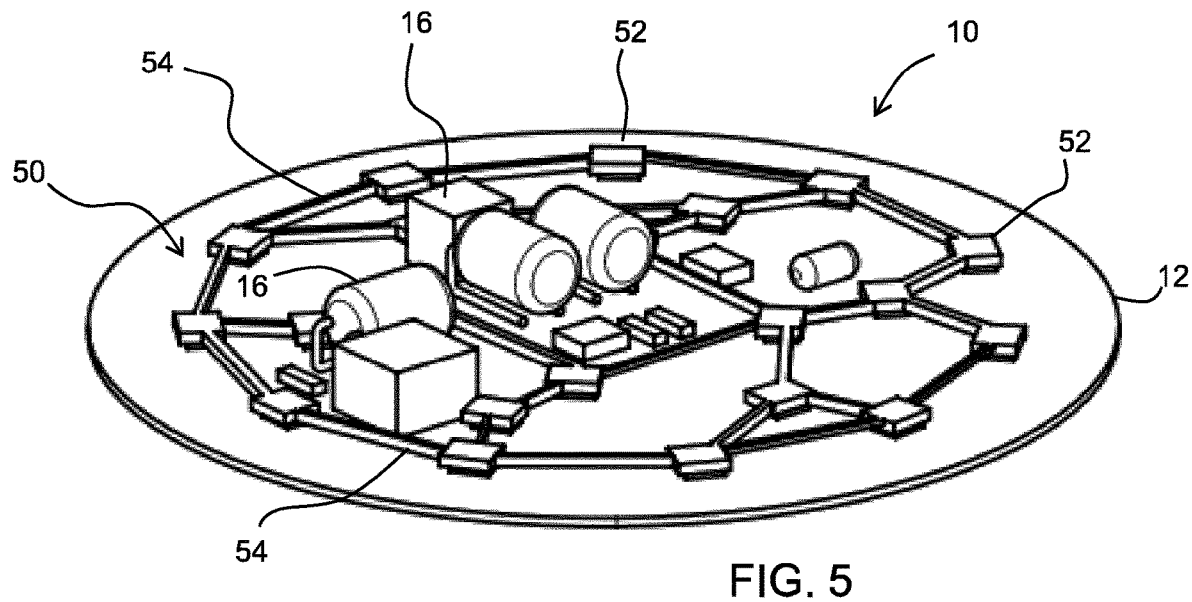
FIG. 5 shows a lighting board with one example of a shielding layer.

FIG. 5 shows an example of the shielding layer 50 over the lighting board. It comprises a mesh of pads 52 and interconnects 54, wherein each pad 52 covers at least the light emitting area of an LED. The full LED may be covered or only a light emitting portion of the top surface of the LED may be covered. The LED is for example a surface mount bare LED chip.

The interconnects enable the shielding layer to be applied (and later removed) as a single unit. The mesh leaves exposed the electrical components.

The underling printed circuit board is preferably white or painted white, so that the shielded areas under the interconnects 54 are also white.

The reflective covering is then applied, preferably by spraying white paint. The shielding layer thus acts as a mask. The shielding layer is then removed, for example by peeling the shielding layer off as a single unit.

The shielding layer is for example a paper layer, with an adhesive on one side to enable the layer to couple at least to the LED surfaces. The shielding layer for example comprise a paper layer over a backing layer, with the desired shape formed as a kiss cut. The paper layer is initially bonded to the backing layer by an adhesive between the two. The paper layer can then be removed and applied to the lighting board using the same adhesive, and it can be subsequently removed from the lighting board.

After applying e.g. spraying the reflective covering, the lighting board has electrical components, other than the LEDs, covered by the reflective covering. This covering is applied after the electrical components and the LEDs have been mounted. In this way, the mounting of the components and LEDs using heat, such as reflow soldering, will not discolor or otherwise damage the reflective covering. The openings prevent light being blocked from the LEDs.

The reflective covering may overlap non-light emitting regions of the set of LEDs. Alternatively, the openings may fully surround the LEDs.

The shielding layer 50 of FIG. 5 is shown as applied to a design with the electrical components in the central area of the printed circuit board. A similar design is of course possible when the electrical components are around the periphery.

Figure 6:
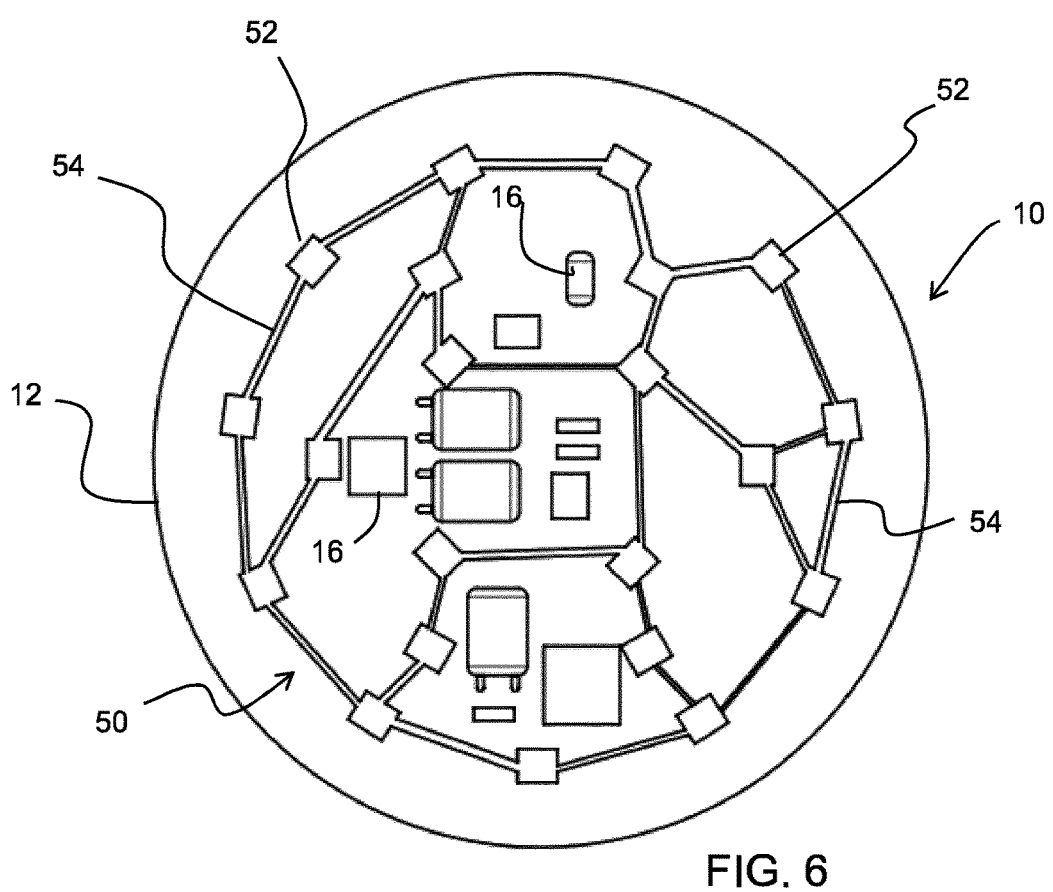
FIG. 6 shows a plan view of the lighting board of FIG. 5.

FIG. 6 shows a plan view of the lighting board of FIG. 5.

Figure 7:
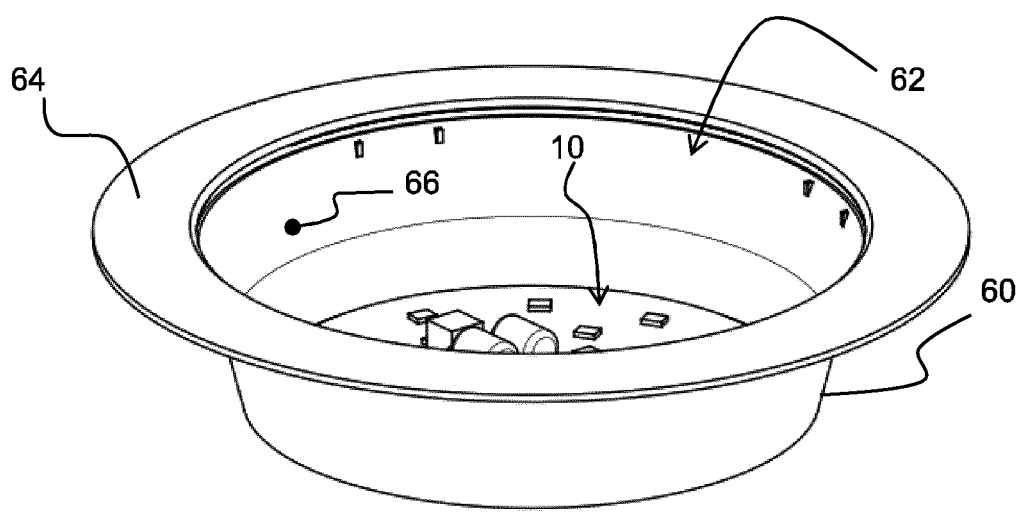
FIG. 7 shows a first example of a luminaire, such as a downlight using the lighting board.

FIG. 7 shows a luminaire, such as a downlight, comprising a housing 60 having an open end 62. The lighting board 10 is within the housing, with the light emitting surfaces of the set of LEDs facing the open end 62 of the housing. In this example, the electrical components are in the central area of the printed circuit board.

The downlight has a rim 64 which seats against a surface such as a ceiling surface when the downlight is installed.

The inner wall 66 of the housing is also reflective.

The inner wall 66 may for example be sprayed or otherwise coated to be white before assembly of the lighting board 10 in the housing. Alternatively, the lighting board may be mounted in the housing before the reflective covering is applied, so that the reflective covering coats both the lighting board and the inner wall 66 of the housing.

A diffuser (not shown) is for example provided at the open end of the housing, which defines a light exit window. However, other optical parts may be provided at the light exit window.

Figure 8:
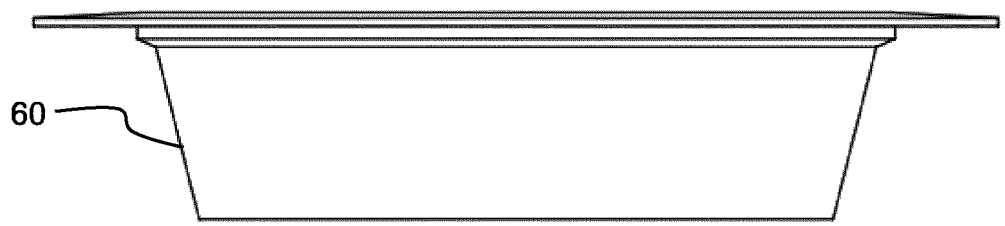
FIG. 8 shows the luminaire of FIG. 7 in side view.

FIG. 8 shows the luminaire of FIG. 7 in side view.

Figure 9:
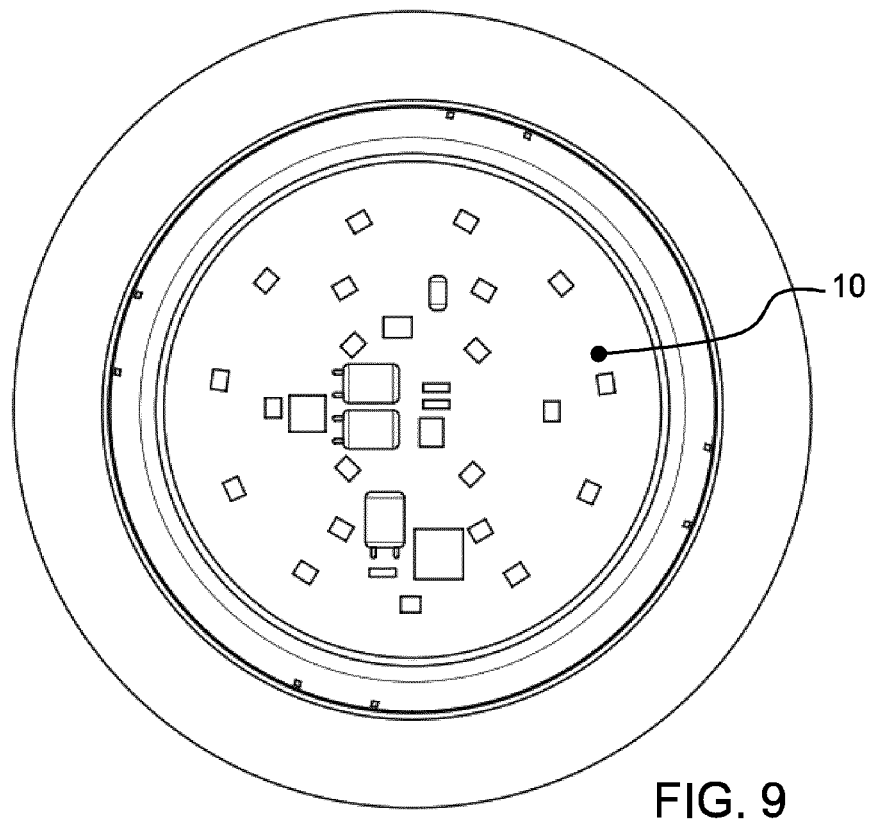
FIG. 9 shows the luminaire of FIG. 7 in plan view looking down at the light exit window.

FIG. 9 shows the luminaire of FIG. 7 in plan view looking down at the light exit window.

Figure 10:
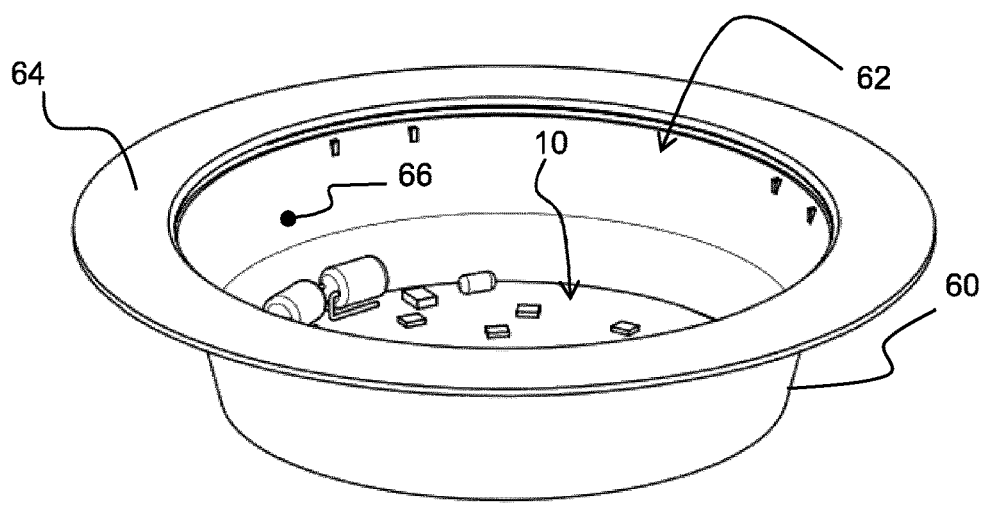
FIG. 10 shows a second example of a luminaire using the lighting board.

FIG. 10 shows another example of a luminaire with the electrical components at the periphery of the printed circuit board.

Figure 11:
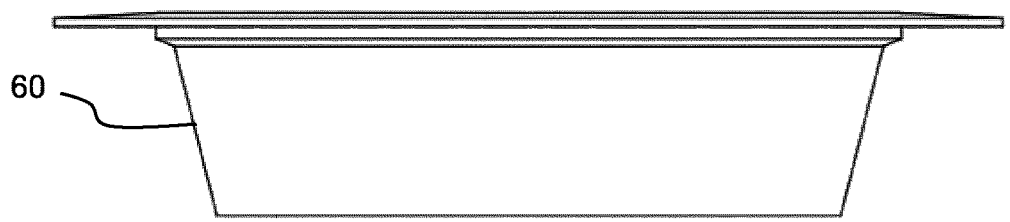
FIG. 11 shows the luminaire of FIG. 10 in side view.

FIG. 11 shows the luminaire of FIG. 10 in side view.

Figure 12:
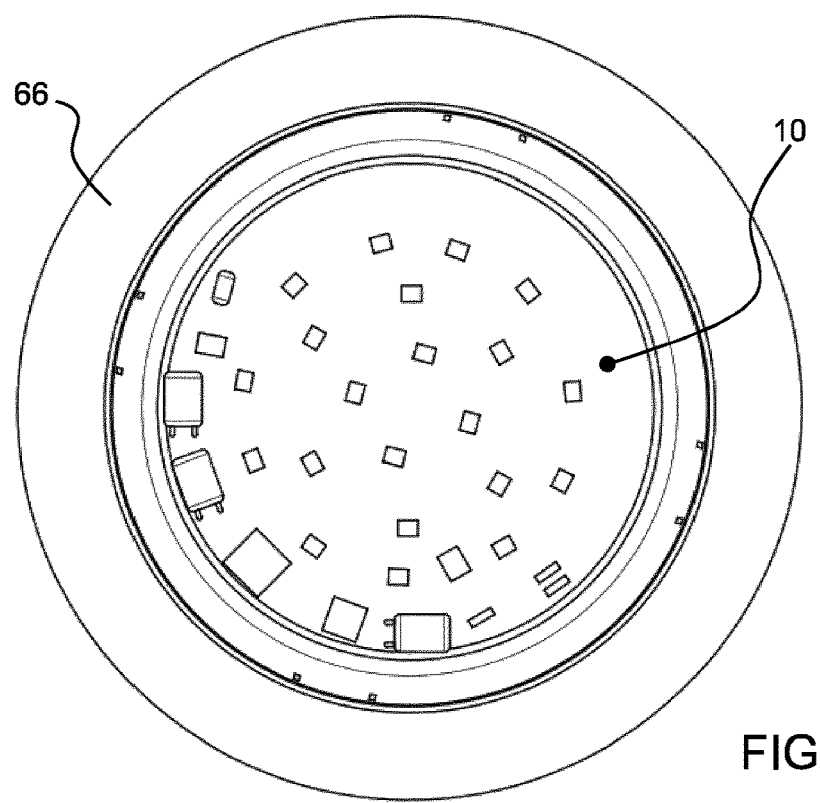
FIG. 12 shows the luminaire of FIG. 10 in plan view looking down at the light exit window.

FIG. 12 shows the luminaire of FIG. 10 in plan view looking down at the light exit window.

The invention may be applied using any solid state lighting element, in particular any lighting element that may be mounted on a printed circuit board. It may be applied to any luminaire, and not only the downlight shown.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A method of manufacturing a lighting board, comprising:
    mounting a set of solid state lighting elements on a printed circuit board;
    mounting a set of electrical components on the printed circuit board;
    providing a shielding layer over at least light emitting surfaces of the set of lighting elements;
    providing a reflective covering over the shielding layer, wherein the reflective covering covers the set of electrical components but is shielded from the light emitting surfaces of the set of lighting elements by the shielding layer; and
    removing the shielding layer;
    wherein the shielding layer comprises a paper mask with an adhesive layer, and removing the shielding layer is by peeling the layer off the lighting elements.

2. The method of claim 1, wherein the reflective covering comprises a white paint and providing the reflective covering comprises spraying the white paint.

3. The method of claim 1, wherein the set of electrical components comprise components of driver circuitry for the set of lighting elements.

4. The method of claim 1, wherein the mounting of the lighting elements and the mounting of the set of electrical components comprises reflow soldering.

5. The method of claim 1, comprising:
    after mounting the set of lighting elements and the set of electrical components on the printed circuit board, mounting the printed circuit board within a housing of a luminaire;
    providing the shielding layer before or after mounting the printed circuit board within the housing of a luminaire; and
    providing the reflective covering over the shielding layer and removing the shielding layer after mounting the printed circuit board to the housing of the luminaire.

* * * * *